(12) United States Patent
Waldspurger et al.

(10) Patent No.: US 9,336,141 B2
(45) Date of Patent: May 10, 2016

(54) HASH-BASED SPATIAL SAMPLING FOR EFFICIENT CACHE UTILITY CURVE ESTIMATION AND CACHE ALLOCATION

(71) Applicant: Cloud Physics, Inc., San Francisco, CA (US)

(72) Inventors: Carl A Waldspurger, Palo Alto, CA (US); Nohhyun Park, Redwood City, CA (US)

(73) Assignee: CLOUD PHYSICS, INC., Santa Clara, CA (US)

( * ) Notice: Subject to any disclaimer, the term of this patent is extended or adjusted under 35 U.S.C. 154(b) by 369 days.

(21) Appl. No.: 13/799,942

(22) Filed: Mar. 13, 2013

(65) Prior Publication Data
US 2014/0281249 A1     Sep. 18, 2014

(51) Int. Cl.
| | | |
|---|---|---|
| *G06F 12/00* | (2006.01) | |
| *G06F 12/08* | (2016.01) | |
| *G06F 17/50* | (2006.01) | |
| *G06F 11/34* | (2006.01) | |

(52) U.S. Cl.
CPC ........ *G06F 12/0802* (2013.01); *G06F 11/3447* (2013.01); *G06F 17/5022* (2013.01); *G06F 2212/601* (2013.01)

(58) Field of Classification Search
CPC ............ G06F 12/0891; G06F 12/0802; G06F 11/3447; G06F 17/5022; G06F 2212/601; G06F 12/08
USPC ........................................................ 711/129
See application file for complete search history.

(56) References Cited

U.S. PATENT DOCUMENTS

| | | |
|---|---|---|
| 2008/0244533 A1 | 10/2008 | Berg et al. |
| 2008/0294846 A1 | 11/2008 | Bali et al. |
| 2009/0313436 A1 | 12/2009 | Krishnaprasad et al. |
| 2011/0231857 A1 | 9/2011 | Zaroo et al. |

OTHER PUBLICATIONS

Gopalan, Kartik, et al., "Improving Route Lookup Performance Using Network Processor Cache", in Conference on Supercomputing, ACM/IEEE, Nov. 16, 2002.
PCT Written Opinion of the International Searching Authority for PCT/US2014/021922, issued Sep. 15, 2015 for PCT application corresponding to present U.S. Appl. No. 13/799,942.

*Primary Examiner* — Matthew Bradley
(74) *Attorney, Agent, or Firm* — Jeffrey Pearce

(57) ABSTRACT

Cache utility curves are determined for different software entities depending on how frequently their storage access requests lead to cache hits or cache misses. Although possible, not all access requests need be tested, but rather only a subset, determined by whether a hash value of each current storage location identifier (such as an address or block number) meets one or more sampling criteria.

36 Claims, 5 Drawing Sheets

HASH-BASED SPATIAL SAMPLING FOR EFFICIENT CACHE UTILITY CURVE ESTIMATION AND CACHE ALLOCATION

FIELD OF THE INVENTION

This invention relates to operation of a cache in a computer system.

BACKGROUND

Caching is a common technique in computer systems to improve performance by enabling retrieval of frequently accessed data from a higher-speed cache instead of having to retrieve it from slower memory and storage devices. Caching occurs not only at the level of the CPU itself, but also in larger systems, up to and including caching in enterprise-sized storage systems or even potentially globally distributed "cloud storage" systems.

For example, caches are commonly included in central processing units (CPUs) to increase processing speed by reducing the time it takes to retrieve information from memory or other storage device locations. As is well known, a CPU cache is a type of memory fabricated as part of the CPU itself. In some architectures such as x86, caches may be configured, hierarchically, with multiple levels (L1, L2, etc.), and separate caches may have different caches for different purposes, such as an instruction cache for executable instruction fetches, a data cache for data fetches, and a Translation Lookaside Buffer (TLB) that aids virtual-to-physical address translation. Access to cached information is therefore faster—usually much faster—than access to the same information stored in the main memory of the computer, to say nothing of access to information stored in non-solid-state storage devices such as a hard disk.

On a larger scale, dedicated cache management systems may be used to allocate cache space among many different client systems communicating over a network with one or more servers, all sharing access to a peripheral bank of solid-state mass-storage devices. This arrangement may also be found in remote "cloud" computing environments.

Data is typically transferred between memory (or another storage device or system) and cache as cache "lines", "blocks", "pages", etc., whose size may vary from architecture to architecture. In systems with an x86 architecture, for example, the transfer size between CPU caches and main memory is commonly 64 bytes. In systems that have a caching hierarchy, relatively slow memory (such as RAM, which is slow compared to processor cache) may be used to cache even-slower memory (such as storage devices). Note also that, in such systems, the transfer size between levels of the cache generally increases, e.g. typically 64 bytes from DRAM to processor cache, but typically 512 B to 64 KB between disk and DRAM-based cache. Just for the sake of succinctness, all the different types of information that is cached in a given system are referred to commonly here as "data", even if the "data" comprises instructions, addresses, etc. Transferring blocks of data at a time may mean that some of the cached data will not need to be accessed often enough to provide a benefit from caching, but this is typically more than made up for by the relative efficiency of transferring blocks as opposed to data at many individual memory locations; moreover, because data in adjacent or close-by addresses is very often needed ("spatial locality"), the inefficiency is not as great as randomly distributed addressing would cause.

A common structure for each entry in the cache is to have at least three elements: a "tag" that indicates where (generally an address) the data came from in memory; the data itself; and one or more flag bits, which may indicate, for example, if the cache entry is currently valid, or has been modified.

Regardless of the number, type or structure of the cache(s), however, the standard operation is essentially the same: When a system hardware or software component needs to read from a location in storage (main or other memory, a peripheral storage bank, etc.), it first checks to see if a copy of that data is in any cache line(s) that includes an entry that is tagged with the corresponding location identifier, such as a memory address. If it is (a cache hit), then there is no need to expend relatively large numbers of processing cycles to fetch the information from storage; rather, the processor may read the identical data faster—typically much faster—from the cache. If the requested read location's data is not currently cached (a cache miss), or the corresponding cached entry is marked as invalid, however, then the data must be fetched from storage, whereupon it may also be cached as a new entry for subsequent retrieval from the cache.

In most systems, the cache will populate quickly. Whenever a new entry must be created, for example because the cache has a fixed or current maximum size and has been filled, some other entry must therefore be evicted to make room for it. There are, accordingly, many known cache "replacement policies" that attempt to minimize the performance loss that each replacement causes. Many of these policies rely on a "least-recently used" (LRU) heuristic, which implements different types of predictions about which cache entries are least likely to be used and are therefore most suitable for eviction.

In some schemes, for various known reasons, including reducing demand on the cache, some memory locations may be marked as non-cacheable, in which case, of course, the soft- or firmware that controls the cache will not create an entry for them on misses. Furthermore, the cache may also be used analogously for data writes. Two common write policies include the "write back," in which modified data is held in the cache until evicted or flushed to a backing store, and "write through," in which modified data is concurrently stored in the cache and written to the backing store.

The greatest performance advantage, at least in terms of speed, would of course occur if the cache (to include, depending on the system, any hierarchical levels) were large enough to hold the entire contents of memory (and/or disk, etc.), or at least the portion one wants to use the cache for, since then cache misses would rarely if ever occur. In systems where the contents of the hard disk are cached as well, to be able to cache everything would require a generally unrealistic cache size. Moreover, since far from all memory locations are accessed often enough that caching them gives a performance advantage, to implement such a large cache would be inefficient. Such theoretical possibilities aside, the reality of modern systems is that the cache will be much smaller than memory, and smaller still than a hard disk.

On the other hand, if the cache is too small to contain the frequently accessed memory or other storage locations, then performance will suffer from the increase in cache misses. In extreme cases, having a cache that is far too small may cause more overhead than whatever performance advantage it provides, for a net loss of performance.

The cache is therefore a limited resource that should be managed properly to maximize the performance advantage it can provide. This becomes increasingly important as the number of software entities that a CPU (regardless of the number of cores) or multiprocessor system must support increases. One common example would be many applications loaded and running at the same time—the more that are running, the more pressure there is likely to be on the cache. Of course, some software entities can be much more complicated than others, such as a group of virtual machines running on a system-level hypervisor, all sharing the same cache. As with other hardware resources, either a human or automatic administrator should therefore preferably carry out some policy to most efficiently allocate the cache resource, to implement some preference policy, etc. This task becomes even more complicated in hosted or "cloud computing" environments, where many physically and/or logically isolated client systems share the memory and storage subsystems of one or a cluster of servers (such as network attached storage servers), storage area networks, etc., with each client system expecting or needing at least some minimum quality of service level. In many cases, client systems may be virtual machines that must be instantiated or loaded and managed and can change in number and workload dynamically.

There are, accordingly, many existing and proposed systems that attempt to optimize, in some sense, the allocation of cache space among several entities that might benefit from it. Note the word "might": Even if an entity were exclusively allocated the entire cache, this does not ensure a great improvement in performance even for that entity, since the performance improvement is a function of how often there are cache hits, not of available cache space alone. In other words, generous cache allocation to an entity that addresses memory in such a way that there is a high proportion of misses and therefore underutilizes the cache may be far from efficient and cause other entities to lose out on performance improvements unnecessarily. Key to optimizing cache allocation—especially in a dynamic computing environment—is the ability to determine the relative frequencies of cache hits and misses.

FIG. 1 illustrates qualitatively a typical "miss ratio curve" (MRC) which is often used to represent cache performance. By convention, an MRC is plotted with the cache size on the X-axis, and the cache miss ratio (i.e., misses/(hits+misses)) on the Y-axis. In the region marked "A" in FIG. 1, the cache is so small that it has a high rate of misses; in this region, the performance loss of handling cache misses could even outweigh any gains achieved for the relatively few cache hits. In the region marked "C", however, the cache is so large that even an increase in its size will bring negligible reduction in cache misses—the cache effectively includes the entire memory region that is ever addressed. In most implementations, at any given moment of execution, the preferred choice in the trade-off between performance and cache size will normally lie somewhere in the region marked "B". In some cache partitioning and allocation schemes (see, for example, U.S. Pat. No. 7,107,403, Modha, et al., "System and method for dynamically allocating cache space among different workload classes that can have different quality of service (QoS) requirements where the system and method may maintain a history of recently evicted pages for each class and may determine a future cache size for the class based on the history and the QoS requirements"), even the slope of the MRC is used to help determine the optimal partitioning and allocation.

A miss ratio curve (MRC) thus summarizes the effectiveness of caching for a given workload. A human administrator or an automated program can then use MRC data to optimize the allocation of cache space to workloads in order to achieve aggregate performance goals, or to perform cost-benefit tradeoffs related to the performance of competing workloads of varying importance. Note that in some cases, a workload will not be a good caching candidate, such that it may be more efficient simply to bypass the caching operations for its memory/storage accesses. The issue then becomes how to construct the MRC.

It would be far too costly in terms of processing cycles to check every memory access request to test if it leads to a cache hit or a cache miss and to construct the MRC based on the results. Especially in a highly dynamic computing environment with many different entities vying for maximum performance, exhaustive testing could take much longer than the performance advantage the cache itself provides. Different forms of sampling or other heuristics are therefore usually implemented. For example, using temporal sampling, one could check for a hit or miss every n microseconds or processing cycles, or at random times. Using spatial sampling, some deterministically or randomly determined subset of the addressable memory space is traced and checked for cache hits and misses.

Many existing MRC construction techniques are based on Mattson's Stack Algorithm, described, for example, in R. L. Mattson, J. Gecsei, D. R. Slutz, and I. L. Traiger. "Evaluation Techniques for Storage Hierarchies", IBM Systems Journal, Volume 9, Issue 2, 1970. The Mattson Stack Algorithm maintains an LRU-ordered stack of references and yields a histogram of stack distances (also known as reuse distances) from which an MRC can be generated directly. Unfortunately, the cost of maintaining and updating the associated data structures is expensive in terms of both time and memory space, even when efficient data structures (such as hash tables and balanced trees) are employed.

Spatial sampling has been proposed in the prior art to reduce the cost of MRC construction, essentially running Mattson's Stack Algorithm over the subset of references that access sampled locations. For example, according to the method disclosed in U.S. Patent Application Publication 2012/0117299 (Waldspurger et al., "Efficient Online Construction of Miss Rate Curves"), a set of pages is selected randomly within a fixed-size main-memory region to generate MRCs for guest-physical memory associated with virtual machines. Earlier computer architecture research by Qureshi and Patt on utility-based cache partitioning (Moinuddin K. Qureshi and Yale N. Patt. "Utility-Based Cache Partitioning: A Low-Overhead, High-Performance, Runtime Mechanism to Partition Shared Caches", in Proceedings of the 39th Annual IEEE/ACM International Symposium on Microarchitecture (MICRO 39), December 2006) proposed adding novel hardware to processor caches, in order to sample memory accesses to a subset of cache indices.

For some applications of MRCs, however, randomly selecting a subset of locations to sample is challenging. In many cases, for example, such as those involving accesses to I/O devices, the entire set of locations from which the sample must be drawn may not be known until after the workload has completed. In other cases, even if the complete set of locations is known up-front, it may span an extremely large range, of which only a small fraction may be accessed by the workload, so that storing even the reduced set of sampled locations may still prove very inefficient. Furthermore, the skewed nature of I/O access patterns can cause pre-selection of random samples from a large storage address space to yield inaccurate results. In some cases, a stratified sampling approach (see <http://en.wikipedia.org/wiki/Stratified_sampling>) can help characterize the space by first dividing it into subgroups. For example, Kodakara et al., in Sreekumar V. Kodakara, Jinpyo Kim, David J. Lilja, Wei-Chung Hsu and Pen-Chung Yew. "Analysis of Statistical Sampling in Microarchitecture Simulation: Metric, Methodology and Program Characterization", in Proceedings of the 10th IEEE International Symposium on Workload Characterization (IISWC '07), September 2007, proposed a stratified sampling approach for processor microarchitecture simulation with a set of benchmarks, using a time-based division of program execution into distinct phases, which are each sampled.

While such techniques can be effective in some cases, they do not work well when access patterns are irregular or non-stationary, resulting in large sampling errors and inaccurate simulation results. An approach that requires neither prior information about workloads nor the ability to analyze or classify program phases is therefore desirable. Moreover, the cost of stratified sampling would be prohibitively high for any inline processing involving a large storage address space.

Unless exhaustive testing is implemented, in order to be able to evaluate cache performance using miss-ratio or (equivalently) hit-ratio statistics, an administrator or automatic software module must decide which memory (or disk or other storage) accesses lead to cache hits (or misses); the universe of memory/disk accesses must be sampled.

DETAILED DESCRIPTION

Figure 1:
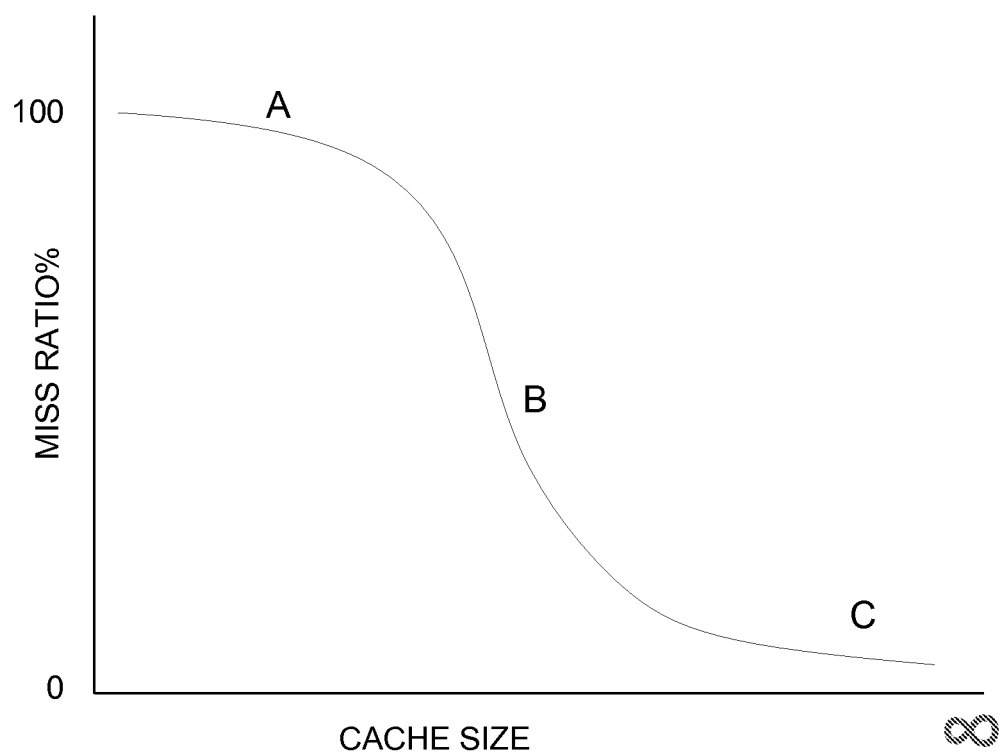
FIG. 1 qualitatively illustrates a typical miss rate curve (MRC).

This invention involves a novel hash-based spatial sampling method that requires no prior knowledge of the system or its input workload. Moreover, no information is required about the set of locations that may be accessed by a workload, nor is information regarding the workload access distribution needed. For each referenced location L, whatever software entity is chosen to determine hit/miss in general decides whether or not to sample a current referenced location L based on whether hash(L) meets at least one criterion.

The "location" L may be a location such as an address, or block number, or any other identifier used to designate a corresponding portion of system memory, or disk storage, or some other I/O device (for example, onboard memory of a video card, or an address to a data buffer, etc.), or any other form of device, physical or virtual, whose identifier is used to create cache entries. Merely for the sake of simplicity, the various examples described below may refer to "memory"; these examples would also apply to other storage devices, however, including disks, volatile or non-volatile storage resident within I/O devices, including peripheral banks of solid-state or other storage media, etc. As before, "data" is also used here to indicate any form of stored digital information, "pure" data as well as instructions, etc.

As is well known in many areas of computer science, a hash function is a function that takes a plurality of inputs (which may be bits or portions of a single data string), which may (but need not) be of variable length, and returns a usually (but not necessarily) fixed-length, smaller (often much smaller) output. Hash functions are used, for example, to reduce entire memory pages or even documents to single numbers that can be used as a form of validating checksum, or addresses can be hashed to create index entries into page tables, etc.

A good hash function normally maps its input to a small, fixed-length output, uniformly distributed over its output range. Many hash functions, including cryptographic hash functions (such as SHA-1, SHA-2 and others in the "Secure Hash Algorithm" family), are effectively randomizing in that a small change to the input value will yield a different hash value, with high probability. Some other hash functions, however, attempt to retain some degree of locality, such that a small change in the input will return an output that is relatively close, in some sense, to the "adjacent" input. See <http://en.wikipedia.org/wiki/List_of_hash_functions> for a list of common hash functions, many of which would be suitable choices for most implementations of this invention. This invention does not require any particular hash function; indeed, it does not require many of the characteristics of some more "advanced" hash functions. For example, the invention does not need to rely on the one-way property of cryptographic hashing. Universal hashing is typically faster, and also provides a desirable "uniform difference property"; see <http://en.wikipedia.org/wiki/Universal_hashing>.

One prototype of this invention implemented hash-based spatial sampling in the context of MRC construction for a trace of disk I/O requests associated with a virtual machine over a given time period. This prototype used the MurmurHash hash function for spatial sampling decisions. A description of this prototype illustrates the more general principle of the invention.

Let L represent a location identifier (such as a disk block number) in the trace, that is, the observed stream of references $(L_1, L_2, \ldots)$, and let $H_{10}=\text{hash}(L)=\mathcal{H}(L)$. (Here, $\mathcal{H}$ indicates the chosen hash function.) Unless otherwise indicated or readily apparent, the description here will use base-10 numbers merely because this is easier for most readers to follow. A sampling fraction Q was then specified with a resolution of 0.1% as an integer value in the range [1, 1000]. If $\mathcal{H}(L)$ mod 1000<Q, then the reference in the stream was sampled, otherwise it was discarded. In this prototype, the sampling criterion was therefore that $\mathcal{H}(L)$ mod 1000<Q. If Q is set to 100, then, on average, only 10% of locations would be tracked to detect whether they led to cache hits or cache misses. Settings of Q=50 and Q=10 would lead to sampling rates of 5% and 1%, respectively.

As one alternative, the modulo operation could also be replaced with a bit mask by specifying the sampling fraction Q as an integer value in $[1, 2^n]$ and using the mask $(2^n-1)$. For example, with n=10, the range would be [1, 1024], and the mask would be $1023_{10}=0\text{x3FF}_{16}$, resulting in the check "$\mathcal{H}(L)_{16}$ & $0\text{x3FF}_{16} < Q_{16}$", where "&" indicates the logical, bit-wise "AND" operation. Assuming the output of the hash is effectively random, any subset of its output bits could be used instead of just its contiguous low-order bits. For example, the system could shift output right by m bits first, or reverse/permute the output bits, or use every other bit, or run the output through a second hash function, etc.

Figure 2:
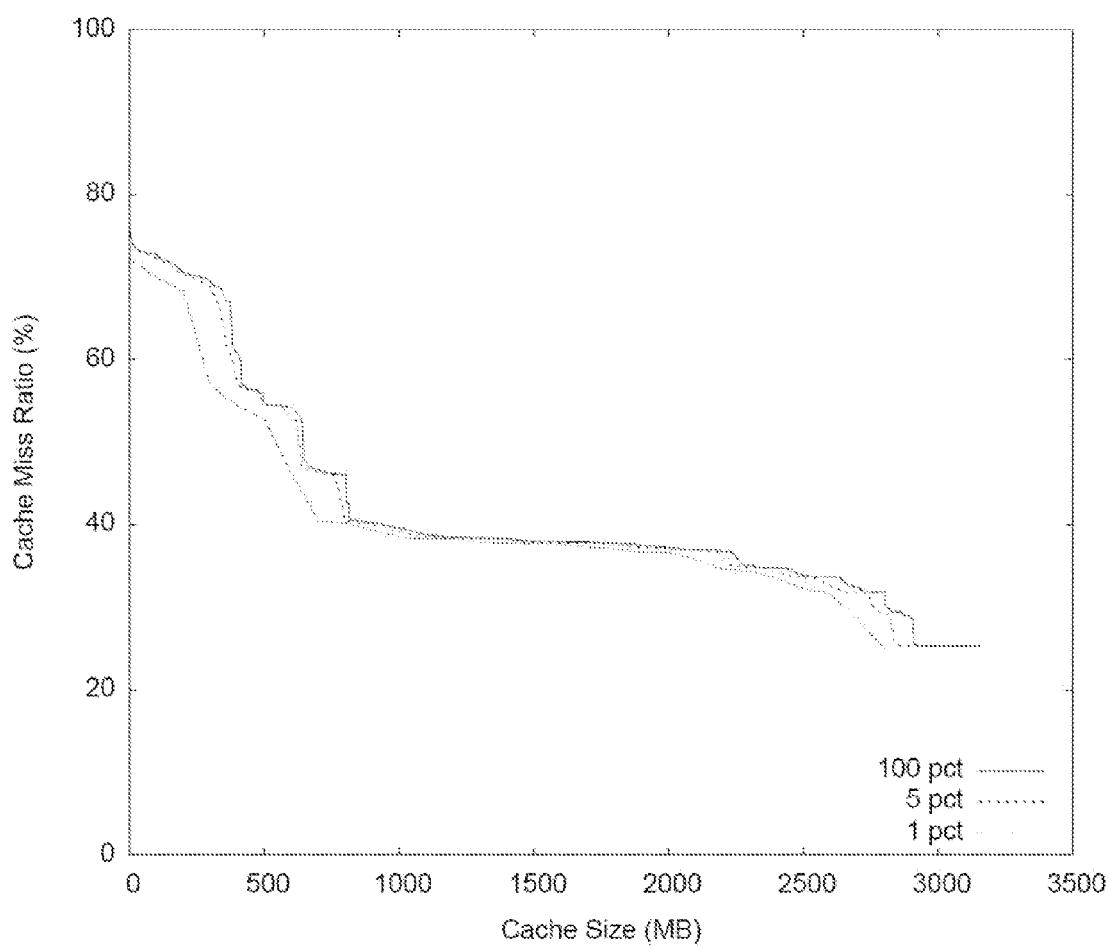
FIG. 2 is a MRC plot illustrating the results achieved by a prototype of the invention.

FIG. 2 plots representative miss ratio curves (MRCs) obtained without sampling, and with 5% and 1% sampling rates, for a 24-hour trace of disk block accesses from a real-world VM workload using the prototype described above. Each MRC plots misses/(hits+misses), and can be converted to a hit-ratio curve (HRC) trivially, by plotting "100−miss %" (HRC) on the Y-axis, as desired. In other words, the system may compute and base decisions on either type of access result ratio, either an access success ratio (a hit ratio) or access failure ratio (a miss ratio). The resulting curves, of either type, are referred to collectively as a "cache utility curve" (CUC), which is preferably (but not necessarily, depending on the implementation) compiled per-client as curve data CUC(Ci). As can be seen, in the example plot, the MRCs computed using hash-based sampled information matched the MRC computed using complete information (exhaustive sampling) surprisingly closely, despite the 20× to 100× reduction in data. Hash-based spatial sampling is even more valuable when used in an online manner to construct a CUC without having to store a trace of the reference stream, because hash-based sampling does not require any knowledge of which set of locations may be accessed by a workload in the future; moreover, with hash-based sampling, there is no need to store or consult a list of sampled addresses.

In some embodiments, it may be useful to vary the hash-based sampling rate adaptively to improve accuracy. One approach is to increase the sampling rate when the "rate of change" of the reuse-distance distribution (see Mattson) is determined to be high (above a first threshold value), and to decrease it when the rate of change is relatively low (below a second threshold value).

Hash-based spatial sampling is well-suited to such adaptive sampling, since the set of locations selected by $\mathcal{H}(L)$ mod M<Q is a proper subset of the set of locations selected by "$\mathcal{H}(L)$ mod M<G" when Q<G. Increasing/decreasing the sampling rate using this invention can be easily accomplished simply by setting Q higher (closer to M) or lower (closer to 0), with similar adjustments being made in implementations with other sampling criteria. As a result, the set of blocks associated with the minimum sampling rate is available consistently throughout an entire run. For example, assume M=100 and Q=5, 20. The criterion $\mathcal{H}(L)$ mod M<Q would then lead to sampling rates of 5% and 20%, respectively. Of course, the modulus M need not be 100, but may be set initially to any convenient value. For example, setting M equal to a power of two may make computations faster, and Q can still be adjusted dynamically to change the sampling rate.

Finally, note that the hash-based sampling method is not limited to CUCs for disk (including solid-state) devices or I/O requests. Hash-based sampling is particularly useful when all requests for data stored in a set of locations that may potentially be cached flow through a common point where sampling decisions can be made. The use of repeatable hash-based sampling makes this easy: Input locations L, compute $\mathcal{H}(L_i)$ for each of these, then mark for later sampling all the locations for which $\mathcal{H}(L_i)$ meets the sampling criterion/criteria. Hash-based sampling does not require such a common point, however. For example, sampling could be done independently for multi-processor channels within a storage system so as to simulate the behavior of a single cache. Independent sampling could also be implemented at multiple different points in a potentially parallel or distributed system. Each sampling point ("tap") could then use the same hash function; in such a case, the collection of all sampling points should ensure that every I/O request (all of which should be observable) is hashed by some sampling point.

For example, to sample P percent of the entire location space, the system may sample a reference if and only if $\mathcal{H}(L)$ mod 100<P. Note that this approach ensures that all accesses to the same location will be sampled, as required for reuse distance computations, since they will have the same hash value. Unlike sampling methods that rely on [pseudo-]random sampling based on time or accesses (such as every Nth reference, random with a mean of N references, etc.) violate the property that if any reference to a location is sampled, then all references to the same location are sampled), hash-based spatial sampling method according to this invention provides repeatability with no need to store a "seed" value: For a given L, $\mathcal{H}(L)$ will return the same value regardless of when it's evaluated or what the sampling criteria (one or more) are.

The criterion for sampling does not have to be "<Q" or indeed "<" at all. It would of course work equally well to set the criterion as, for example, or $\mathcal{H}(L)$ mod M E [range(s) of values] or $\mathcal{H}(L)$ mod M>Q, etc., and may combine more than one condition. Similarly, the bit mask could be chosen to detect not a value that is less that or greater than the sampling fraction, but rather a particular bit pattern. For example, if the sampling criterion is that the five least-significant bits of $\mathcal{H}(L)$ are $11111_2$ or $00000_2$ (or any other five-bit pattern), then the criterion would be fulfilled for 1/32 of the locations, for a sampling percentage of about 3.1%; testing for a pattern in the three least significant bits would lead to a sampling frequency of 1/8 or 12.5%, etc.; such criteria may also be implemented using a bit mask. Skilled software designers or mathematicians will easily be able to implement other sampling criteria.

In this discussion, it is assumed merely by way of illustration that the system samples if the hash function meets the sampling criterion. Of course, one could also equivalently design the system such that it excludes a storage location from sampling if the location's identifier's hash meets the criterion. For example, the "inclusive" criterion $\mathcal{H}(L)$ mod 100<Q could easily be converted into the "exclusive" criterion such as, for example, $\mathcal{H}(L)$ mod 100≥Q.

If $\mathcal{H}(L)$ for a current location L that has been addressed meets the sampling criterion, then known methods may be used to trace the cache access and detect whether a hit or miss occurs. Note that whether a hit or miss occurs also depends on the cache size. After enough samples have met the criterion and been traced, a statistically meaningful value of the miss ratio (or hit ratio, depending on the design choice) for the size of the given cache allocation will be available, which the system administrator (human or automatic) can then use to adjust the allocation if needed.

The surprisingly high accuracy of even a relatively small—indeed, very small—sample chosen using the hash-based spatial sampling technique described here, together with the relative speed of computation of a hash function compared with conventional approaches, means that the invention is better suited for real-time, dynamic cache allocation adjustments. In some implementations, it may be advantageous to transform or filter out references Li (such as from a trace of references) for even for reasons other than sampling, to reflect specific cache policies or cache implementation details. One example of a non-sampling transformation would be that the raw trace may represent each access as a "start location" and "size", which is then converted into a sequence of cache-block-sized block accesses (for example, converting "offset=1 MB, size=32 KB" into two accesses to 16 KB blocks at block locations 64 and 65, since 64*16K is the block at 1 MB, and 65*16K is the next consecutive block). The hash function could then be applied to L=64 and L=65 for separate sampling decisions. An example of a non-sampling filter based on cache policy would be to discard all I/O requests larger than a certain size (for example, bypassing the cache for large I/Os with sizes above some threshold such as 1 MB, since a disk can process such large sequential I/O requests relatively efficiently). Another example would be to filter out all I/O requests of a certain type, such as writes.

Figure 3:
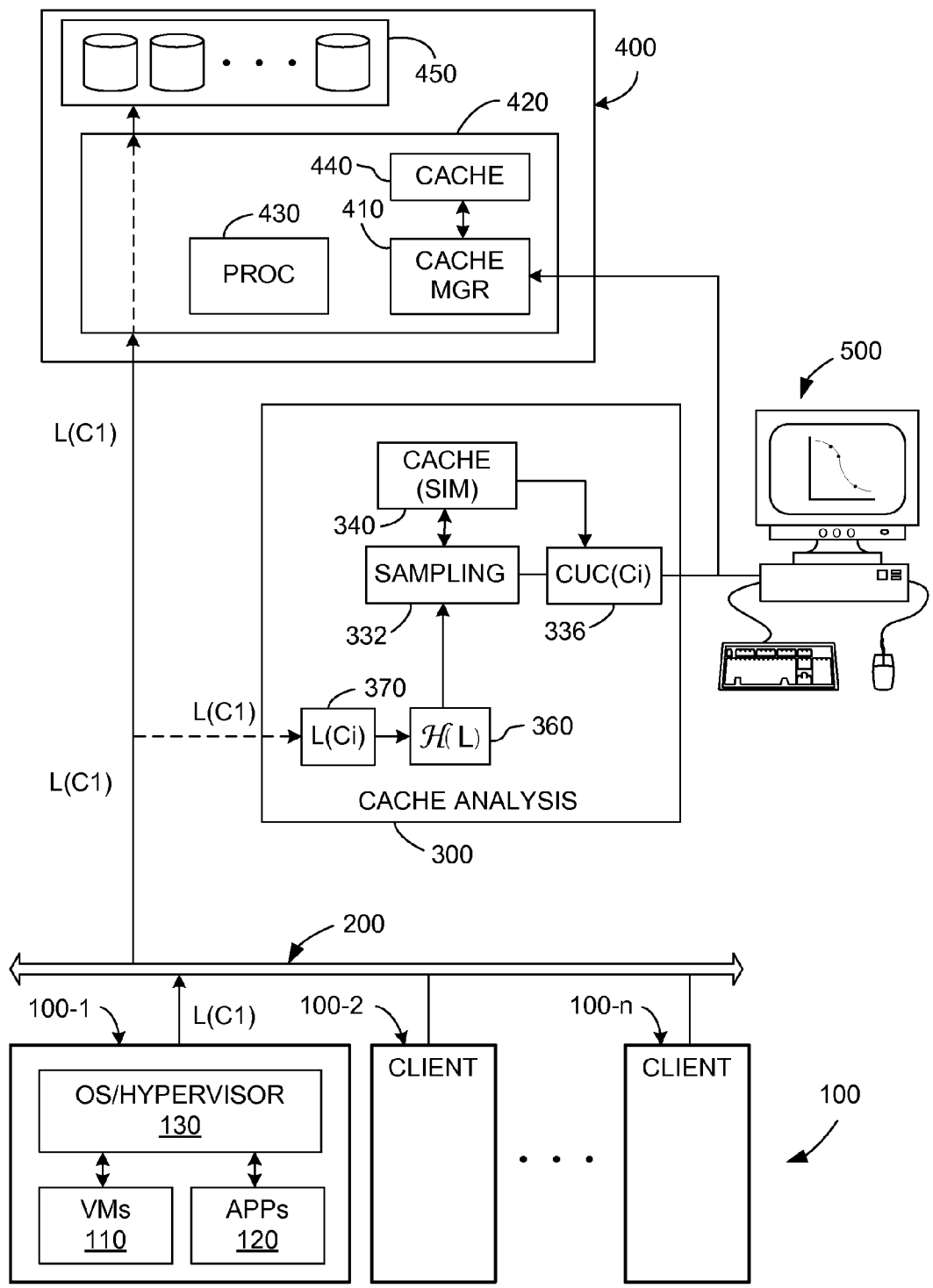
FIG. 3 illustrates one example of a system that implements various aspects of the invention.

FIG. 3 illustrates a representative system that implements an embodiment of the invention useful for compiling dynamic and possibly real-time, in-line information useful for decisions regarding cache allocation. A plurality of clients 100 includes, by way of example, a system 100-1 that in turn includes virtual machines 110 and other applications 120 running on a hypervisor/operating system 130; as well as other clients 100-2, ..., 100-n.

A primary system 400 includes at least one storage system 450, which may be of any type or configuration, from a single disk to a mixed storage technology system spread over multiple servers and locations in the "cloud". An access management system 420, which may be a dedicated system or simply the storage access components of a conventional server, mediates I/O operations with the storage system 450 and will typically include one or more processors 430. In this example, the primary system is shown as including a cache 440 (which may be part of the processing system 430 itself) and a component (software, firmware, etc.) 410 that manage cache operations such as cache 440 partitioning (if implemented) and allocation for entities, such as the clients 100, that issue read and write requests to the storage device(s) 450. As is mentioned below, however, some embodiments of the invention may help the administrator of the primary system decide whether to include a cache at all.

The storage devices 450 may, but need not be located in the same place (such as in a distributed "cloud" storage environment) and may be of any type, such as solid-state devices (SSDs), including but not limited to flash drives, RAM-based storage systems, or slower electromechanical storage systems. The storages devices may be of different technology types, and may have any block or page size. The only assumption is that there is some form of location identifier L that may also be used to identify a corresponding cache entry if the data at L is in fact cached.

The clients are any entities that address the storage system 450 either directly or, more likely, via one or more intermediate address translations. Depending on the chosen implementation, the clients may communicate data requests to one or more cooperating servers 300 via a bus, a network, or any other communications channel, all of which are indicated collectively by reference number 200. In some implementations, all or some of the clients 100-1, ..., 100-n (also referred to as C1, ..., Cn for succictness) may be incorporated into the primary system 400 itself, in which case no network will normally be needed for them. In the illustrated example, one of the virtual machines 110 has issued a read request for data at location L. (For simplicity and clarity, any intermediate address translations L→L'→L", etc., are ignored here.) Note that, depending on the embodiment, the individual VMs 110 may be considered to be clients, rather than, or in addition to, the overall virtualization platform 100-1. This invention does not presuppose any type of client, which may be any software entity—or any combination of software entities—that addresses the storage system 450 and whose possible or actual need for cache allocation is to be tested and, optionally, adjusted.

In the embodiment illustrated in FIG. 3, one or more of the clients 100-1 (C1), 100-1 (C2) ..., 100-n (Cn) transmit respective streams of reference requests L(C1), L(C2), ..., L(Cn) to access the storage system 450 (all or for only designated clients) are passed to or tapped by a cache analysis system 300, which may be free-standing or incorporated into another system, including the primary system 400. The cache analysis system 300 here includes a buffer/storage component 370, which may be a hardware device such as a flash memory, disk, RAM, access to an external storage (even directly to the storage system 450), that stores the location identifiers L submitted by any or all of the clients that one desires to construct an MRC for. In some implementations, the references (submission of storage location identifiers L) of more than one, or even all, of the clients, for example, all of the VMs on a single host, may be considered as a whole for analysis. In other cases, however, cache analysis is preferably done per-client so as to be able to construct a separate cache utility curve CUC(Ci) for each client Ci. For per-client analysis, each reference may be tagged in any known manner with a client identifier such that the respective client's references are segregated for storage and processing. The storage component 370 is therefore shown as segregating submitted identifiers L(Ci) per-client, although it could also be arranged through filtering that only one client's identifiers are captured and stored at a time for analysis. The cache analysis system 300 includes a module 360 to calculate the hash value $\mathcal{H}$ (L). Since hash functions are well known, the programming of such a software component is well within the skill of programmers who work with memory and cache management. The hashing module 360 computes the hash function for the currently requested data location identifier L. The result of the hash function evaluation is then passed to a sampling module 332, which evaluates whether the hash of the current location identifier L meets the currently set criterion, and then submits requests that do to a simulated cache component 340 to test whether there is a hit or miss.

The results of the hit/miss testing are made available to a cache utility curve (CUC, such as an MRC or HRC) compilation module 336 that may compile the results as per-client statistics, for example, in value range bins such as are used to form histograms. Particularly in implementations that are fully automated, the per-client CUC(Ci) results may then be passed to a workstation monitor 500, which can then display the current CUC(Ci) estimate, for example, for a selected client. The monitor 500 may also be included to allow a system administrator to communicate various parameters to the sampling module 332 to change the sampling criterion, etc. The CUC results are preferably also, or instead, passed to the cache manager 410, which then may then adjust, either under operator control or automatically, the current cache allocations for the respective clients so as to improve the cache performance.

The concept of hash-based sampling does not presuppose any particular method for simulating the cache. There are different ways to simulate a cache, which also leads to different ways to "adjust" the size of the simulated cache 340. One example is simply to allocate a portion of system memory to act like a cache, loading and evicting entries as if it were a real cache. In such a case, it will typically be necessary to implement more than one simulated cache so as to be able to determine the miss ratio ("Y-axis") for enough simulated cache sizes ("X-axis") to compile a CUC; alternatively, the same set of inputs L would be need to be tested multiple times against a single simulated cache with different simulated sizes, which would increase processing time. In other words, in this example, a part of system memory is treated as if it were a real cache. Note that it is possible to simulate the cache by storing only the cache metadata (including the per-entry tag aka "location", and perhaps other flags like "dirty"). It is not necessary to store the actual cached data itself since the caching routine doesn't depend on the actual data contents, but rather only the location alone. Since the tag size is typically much smaller than the data size, this would have the benefit of reducing the memory footprint significantly.

One of the advantages of Mattson's LRU-based stack algorithm is that it enables capture of information (via stack/reuse distances) for all possible cache sizes at once, which can then be used to construct an MRC. Consider that, according to the standard Mattson algorithm, a miss will occur whenever the reuse distance of a current reference is greater than the current cache size. Assume, for example, that the cache size (or the cache size currently allocated to an entity) is B cache blocks (or other units). Any location whose reuse distance (stack distance) is greater than B will be considered a miss; in essence, since the request is "too far" from the top of the stack, it doesn't "fit" within the current cache allocation. Given a set of location identifiers Li, the LRU ordering, and the currently assumed "cut-off" B, the Mattson algorithm can therefore determine whether there would be a hit (LRU_distance(Li)<=B) or a miss (LRU(Li)_distance>B). But note that the Mattson algorithm can determine whether there would be a hit or a miss for Li for any chosen B, or in fact for a set of different values Bj, given a current LRU stack. The number of misses (or hits, depending on when an MRC or HRC is used) can therefore be incremented for every Bj for which LRU(Li)_distance>Bj. Given a series of location requests Li, an entire MRC can therefore be constructed, by comparing LRU(Li)_distance with each of Bj using a single simulated cache, which can be defined by the "available" size of the LRU stack. Note that the LRU stack could even be big enough to include an entry for every possible Li, but its effective size for purposes of determining hit/miss can be varied by changing the "cut-off" threshold B.

These properties of the Mattson LRU-based stack algorithm lead to another way to implement the simulated cache 340: As long as an LRU stack is maintained, it is possible to determine hit/miss for all cache allocation sizes of interest for each L, regardless of whether there is any memory assigned to as a simulated cache or not; in effect, the LRU stack itself functions as the simulated cache 340. Other non-Mattson cache simulation algorithms may of course also be implemented as the simulated cache 340, with changes such as any supporting data structures needed; these will be understood by skilled programmers who deal with cache operations.

Note that a single CUC (in particular, MRC or HRC) represents miss/hit rates for an entire range of possible cache sizes. In most implementations, the system (human operator or automatic software module or both) will attempt to find some optimal allocation setting for multiple clients. A single client would of course have no competition for cache space at all; nonetheless, the invention may also be useful in single-client situations by providing cache-sizing information, which may be useful for decisions relating to reallocation of unnecessary cache space (for example in main memory or on an SSD) for non-caching purposes. For automated cache allocation decisions, the cache analysis system may compute the CUCs for different clients, and then the cache manager 410 may choose an efficient operating point (cache size) for each client that maximizes a utility function, such as reducing aggregate misses (across all clients) the most, or a priority-weighted function of miss rates across clients, etc. The system may also attempt to find a point or a range on the CUC that has been pre-defined as optimal in some user-chosen sense. By looking at estimates of first and maybe second derivatives of the MRCs for the various clients, for example, the system could attempt to choose cache allocations that get as many higher priority clients as possible in the range between some estimate of A and B (as illustrated in FIG. 1), such as just beyond the "knee" or "fall-off" (relatively faster changing first derivative) of the MRC.

In an online system that makes fine-grained dynamic cache allocation decisions, the per-client MRCs may be updated incrementally in an online manner; allocation decisions may then be made periodically using the current set of per-client MRCs. As mentioned above, the core concept of the invention—hash-based sampling—does not presuppose any particular method for cache simulation. The system could, for example, also generate an MRC for a cache using a non-LRU replacement policy. In such a case, a method such as Mattson's, which is based on a stack algorithm that exhibits a stack inclusion property, may not be able to simulate all cache sizes at once, but the system could instead use multiple simulations of caches at different sizes (either in parallel, or sequentially), each fed with hash-sampled accesses. In the case of parallel cache simulation, the simulated cache component 340 would thus in effect comprise a plurality of simulated caches of different sizes.

Other parameters that an administrator might want to set and adjust in the sampling module 332 might be how often sampling and MRC-construction should be done, or what the first and second threshold values should be. Typical times might be on the order of minutes or even hours, but the decision could also be based on a large enough (determined by the administrator) change in the number and/or type of clients that need to share the cache. Of course, all such manual settings could also be accomplished automatically by programming suitable heuristic algorithms.

Some caching systems, such as some flash-based storage, can also cause a net loss of performance as a result of caching policies regarding cache block size and write caching. For example, a cache may be designed to cache read-heavy workloads, using a write-through policy with a default cache block size larger than default size of a write. A write to a block that isn't already cached may then first cause the cache to issue a larger-sized read of the enclosing block, followed by a smaller write to both the cache and backing disk. This has two effects: 1) a beneficial pre-fetching effect—the spatial locality mentioned above; and 2) additional overhead due to write-induced reads. In some cases, such as write-heavy workloads, 2) outweighs 1) by a large enough margin that the cache has no net benefit, or is even a net loss. Some systems may therefore benefit from creating two MRCs—one for the main misses, and one for write-induced misses. The system may then, for example, subtract the two MRC (or HRC) curves to determine the "net reads saved" by caching.

The miss "ratio" indicates relative frequency of hits and misses, but another parameter that is discussed in the literature and used in some allocation schemes is the miss (or, equivalently, hit) "rate" (collectively: "utility rate") which typically measures misses per system event, which may be any measurable system quantity that can be monitored; examples include low-level events such as "instructions executed" (either as an absolute number or per some unit time), elapsed real or virtual time, "TLB misses", etc. that could be measured by a hardware performance counter, higher-level application-specific events such as "number of transactions processed", workload-specific and application-level operations such as "database query count", etc. Utility rate curves may then be compiled and used in a manner similar to cache ratio curves.

For optimizing cache allocations across multiple clients, some embodiments may also measure and use the number of hits per unit time. For example, if the hit ratio for client A is much higher than that for client B, but if B has many more accesses than A, then allocating more cache to B (despite its lower hit ratio) may save more total disk accesses over a given time period. Hit rate information may be incorporated in any known manner into the chosen allocation routine programmed into the module 330.

There are different design and purely administrative choices when it comes to how often a CUC should be constructed for a given client or set of clients. In some cases, static choices may be preferred, such as redoing the CUC-compilation process every n minutes, or every day or hour, or whenever a new client or number of clients enters the system, when some other significant change to the workload is detected, etc. In some other cases, such as where the CUC is constructed online, it may be advantageous to include some form of periodic reset or "aging" to weight more recent accesses more than older accesses. For example, the system could periodically age/decay per-histogram-bucket counts by, for example, dividing the values by two or by applying a decay factor, if such histograms or equivalent structures are used to compile miss statistics. Examples of other possible aging techniques include using a moving average of values and exponentially-weighted moving average (EWMA).

Figure 4:
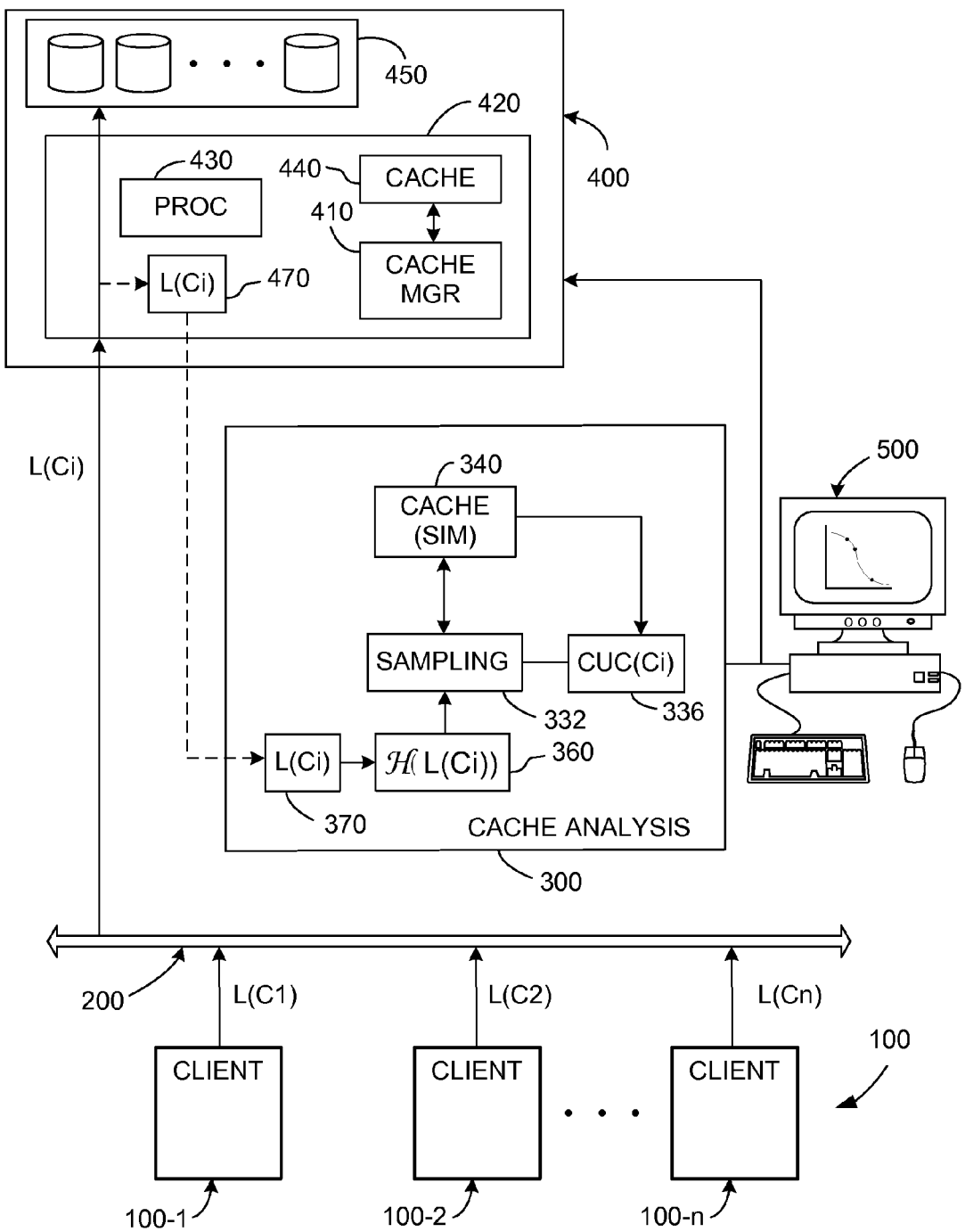
FIG. 4 illustrates an offline implementation of the invention.
Figure 5:
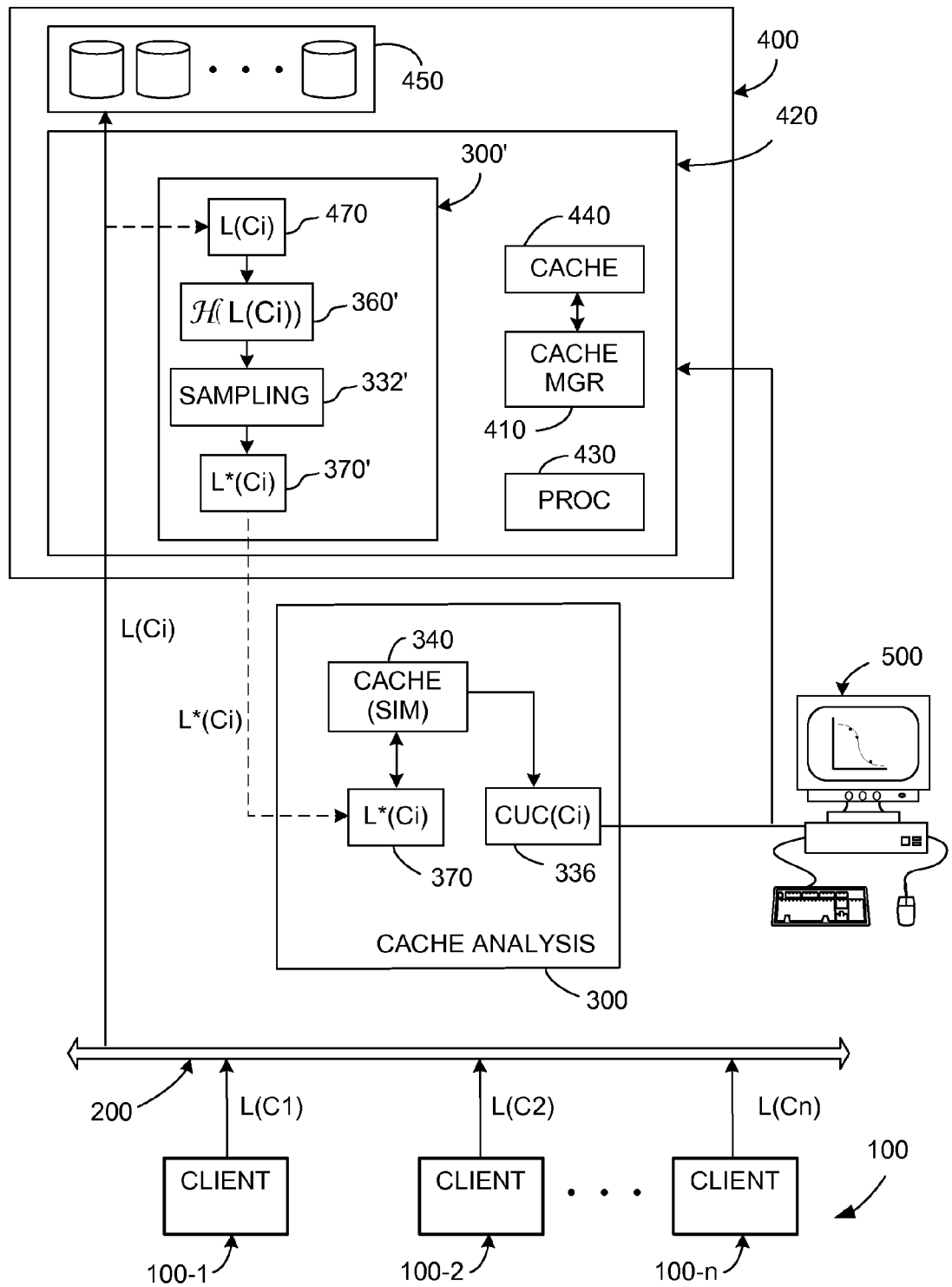
FIG. 5 illustrates another offline implementation of the invention with partial extension of some cache analysis functions into a primary system that includes addressable storage.

FIGS. 4 and 5 illustrate system configurations that are variations of the configuration shown in FIG. 3 that enable practical, off-line, high-speed construction of an MRC using a cache simulation taking as input an actual reference stream.

See FIG. 4, which illustrates an example of an offline, "batch" embodiment. As in the real-time, in-line embodiment illustrated in FIG. 3, the client entities 100-1, 100-2, ..., 100-n submit respective streams of storage access requests L(C1), L(C2), ..., L(Cn) either directly or via the network 200, or both, to the primary system 400.

There are different ways to compile the set of location identifiers used for sampling. One way would be for the cache analysis system 300 to tap the location identifier stream L(Ci) in real time (either via a per-client filter or using segregated, per-client storage) as in the embodiment of FIG. 3 and store the corresponding addresses in the component 370. Assume, however, that a system administrator (as opposed to the cache analysis system 300) wishes to examine how best to allocate actual cache for a given set of clients. The administrator itself could compile a log 470 (total, or perhaps a subset, such as identifiers submitted only by clients of interest) of the submitted location identifiers L and then transfer these to the storage component 370 of the cache analysis system 300 for processing. The log 470 could be transferred on a physical medium such as a disk, flash drive, hard drive, etc., or by downloading over a network, depending on the size of the log file and required transfer speed. Hash computation, sampling of the simulated cache, and compilation of the CUC may then be carried out as before, on the basis of the location identifiers stored in the component 370. The CUC can then be presented in any desired manner, such as on the display of a monitor 500, or sent to the administrator of the primary system 400 to help him determine proper allocation of any actual cache used, or, indeed, if there needs to be a cache at all.

The set of all submitted location identifiers can quickly grow very large. To transfer the entire set even for a single client may therefore in some cases take too many processing cycles from the processing components controlling the system 400, or require undesirably large bandwidth and transfer time or require special protocols and arrangements. FIG. 5 illustrates a variation of the configuration of FIG. 4 that reduces some of this problem.

In FIG. 5, an agent or similar software module 300' is co-located with the primary system 400. This module 300' includes not only the storage module 470 for location identifiers, but also the modules that handle hash computation 360' and sampling 332'. In effect, in this embodiment, the hashing and sampling modules 356, 332 have thus been "moved" into the primary system, such that the cache analysis system 300 is partially extended into the primary system. The hash value for each identifier L can thus be pre-computed, and compared with the sampling criterion, and only those (indicated as L*) that meet the criterion can then be passed on to the cache analysis system 300 and tested against the simulated cache 340 for the hit/miss determination and construction of the CUC in the module 336 as usual. Because hash-based sampling often leads to a surprisingly accurate CUC even with low sampling rates, the amount of data that needs to be transferred to the cache analysis system is also greatly reduced.

As mentioned above, most implementations of the invention will want to determine cache utility curves per-client and will consequently tag and/or segregate storage references for each client so as to make separate processing more efficient. In cases where one or more clients is a virtual machine, each client Ci may maintain and transmit a buffer of sampled locations L*(Ci), independent of its actual accesses to the real storage system. This could be implemented, for example, via a filter driver in the guest OS within a VM, or via a filter driver in the hypervisor. For example, traces may be collected on each host using block trace collection tool such as "ESX vscsiStats" in VMware-based systems, which can collect separate traces for VM virtual disks. The block trace tool could even be modified itself to perform sampling to reduce the data that the hypervisor needs to send for cache analysis. Once the raw trace data is extracted from the hypervisor, it could be sampled before sending it off for analysis; alternatively, the entire trace maybe sent off for analysis, with sampling applied later during the analysis itself.

The hash-based sampling method described here is particularly advantageous for compiling some notion of a CUC to provide information that can be used to allocate cache space among various entities/clients, but it may also be used in other applications as well. For example, hash-based sampling could be used to determine which accesses to run through a cache simulator. Hash-based cache access may also be used in otherwise known routines to optimize cache block size, to optimize other parameters/choices such as cache replacement policy, etc.

One advantageous aspect of various embodiments of the invention is that they effectively provide a stateless mechanism that can automatically track underlying cache distribution. Note, for example, that the invention may sample more if the I/O rate increases and it will generally sample address ranges that are more frequently accessed since all addresses are hashed. Different embodiments of the invention therefore may offer an improvement in terms of detection of "phase changes"—since the invention is able to track the underlying distribution at any given time, it can also detect peaks of the underlying distribution to detect phase change. This then provides information that can be used to reconfigure cache settings, allocations or even the chosen revocation algorithm.

In most cases, a CUC will be compiled for each entity of interest, that is, for each entity Ci one wishes to determine efficient cache allocation for. Location identifiers L(Ci) are in such cases preferably stored, hashed, sampled and evaluated per client; in other words, each CUC will typically be associated with a particular client. This is not necessary in all cases, however. For example, in some systems, the main question of interest may be if a cache is beneficial at all, since cache operations themselves take processing time. A CUC can in such cases be complied for all clients without differentiation, such that the CUC will represent an aggregate cache performance. The system designer or administrator can then determine whether to implement a cache or, if so, how large to make it. Hash-based sampling is particularly advantageous in such cases, since it may reduce the computational burden of this task by orders of magnitude.

In the embodiments discussed above, by way of example, the CUCs are shown as informing cache reallocation code (in the cache manager 410) that essentially then partitions a single large cache 440 into smaller per-client caches, each of which operates independently (between reallocations) using LRU replacement. This is not a necessary assumption for this invention. Instead, even if the large cache is managed as a single large cache, the cache replacement policy could use CUC information when making individual replacement decisions. As one example, suppose the cache manager 410 randomly selects N candidate lines (blocks) to victimize; it may then choose which one to replace based on the derivatives of the CUCs associated with their respective clients.

We claim:

1. A method for evaluating interaction between a cache in a computer system and at least one entity, where each entity submits a stream of location identifiers corresponding to data storage locations in a storage system, the method comprising:
   for each of at least one of the entities, determining, for each of a plurality of cache size allocation options of a simulated cache, a cache utility value as a function of the frequency with which the simulated cache includes cache entries corresponding to a selected sample of the entity's submitted identifiers;
   sampling the stream of location identifiers by selecting at least a sub-set of the stream and, for each selected location identifier in the stream:
      computing a respective hash value as a hash function of the selected location identifier;
      computing a modular arithmetic remainder of the hash value relative to a modulus;
      determining whether the modular arithmetic remainder satisfies a simulated cache inclusion criterion;
      selecting, as the selected samples of location identifiers, those location identifiers whose modular arithmetic remainder satisfies a simulated cache inclusion criterion;
   and
   compiling the cache utility values for determination of respective cache utility for the respective entities.

2. A method as in claim 1, in which the simulated cache inclusion criterion is that a function of the hash value falls within a numerical range.

3. A method as in claim 2, further comprising, by changing the numerical range, changing the percentage of storage location identifiers that are sampled.

4. A method as in claim 2, in which the function of the hash value is an inequality and the numerical range is a subset of a larger numerical range.

5. A method as in claim 1, further comprising:
   evaluating a reuse-distance distribution for the simulated cache entries and a rate of change of the reuse-distance distribution;
   increasing the rate at which submitted identifiers are sampled when the rate of change is above a first threshold value and decreasing the rate at which the submitted identifiers are sampled when the rate of change is below a second threshold value.

6. A method as in claim 1, in which the cache utility value is a cache utility ratio, further comprising adjusting the cache utility ratio as a function of time since the storage location identifiers have been submitted by the currently selected entity.

7. A method as in claim 1, in which the cache utility value is a cache utility rate, further comprising:
   measuring the respective cache utility rate for the entities; and
   allocating cache space among the selected ones of the entities also as a function of their respective cache utility rates.

8. A method as in claim 7, in which the cache utility rate indicates cache access results per system event.

9. A method as in claim 8, in which the system event is chosen from the group: instructions executed, either as an absolute number or per some unit time; elapsed time; translation lookaside buffer (TLB) misses; number of transactions processed; application-level and workload-specific operations such as database query count.

10. A method as in claim 1, in which the cache utility value is a cache miss ratio.

11. A method as in claim 10, further comprising providing the cache miss ratios for each entity in the form of a miss ratio curve (MRC).

12. A method as in claim 1, in which the cache utility ratio is a cache hit ratio.

13. A method as in claim 1, further comprising:
   simulating the cache as a least-recently used (LRU) data structure configured as a Mattson stack;
   varying the cache size allocation options hypothetically by changing a reuse-distance cutoff value; and
   determining whether the simulated cache includes cache entries corresponding to the sampled location identifiers by comparing a current reuse distance associated with each of the sampled location identifiers with the reuse-distance cutoff value.

14. A method as in claim 13, further comprising:
   evaluating a reuse-distance distribution for the cache entries and a rate of change of the reuse-distance distribution; and
   increasing the rate at which the identifiers are sampled when the rate of change is above a first threshold value and decreasing the rate at which the identifiers are sampled when the rate of change is below a second threshold value.

15. A method as in claim 1, in which the cache utility value is a cache utility ratio, further comprising:
   receiving the storage location identifiers in a cache analysis system that is remote from the storage system and includes the simulated cache; and
   determining the cache utility ratios in the cache analysis system.

16. A method as in claim 1, in which the cache utility value is a cache utility ratio, further comprising:
   in a primary system, partitioning a single actual cache into smaller per-entity caches, each of which operates independently; and
   the relative sizes of the per-entity caches are allocated and adjusted according to their respective cache utility ratios.

17. A method as in claim 1, in which the cache in the computer system includes entries from multiple entities, further comprising individually replacing or evicting cache entries as a function of the cache utility values of the respective entities.

18. A method as in claim 1, in which the cache in the computer system is managed using a non-Least-Recently-Used replacement policy for entries from a plurality of the entities, further comprising:
   providing a simulated cache for each entity; and
   compiling the cache utility values per simulated cache.

19. A method as in claim 18, in which the simulated caches function sequentially.

20. A method as in claim 18, in which the simulated caches are provided simultaneously and function in parallel.

21. A method as in claim 1, further comprising implementing the plurality of cache size allocation options by providing a corresponding plurality of simulated caches of different sizes.

22. A system for evaluating interaction between a cache in a computer system and at least one entity, where each entity submits location identifiers corresponding to data storage locations in a storage system, comprising a processor and a cache analysis system including software modules provided, for each of at least one of the entities:

for determining, for each of a plurality of cache size allocation options of a simulated cache, a cache utility value as a function of the frequency with which the simulated cache includes cache entries corresponding to a selected sample of the entity's submitted identifiers;

for sampling the stream of location identifiers by selecting at least a sub-set of the stream and, for each selected location identifier in the stream:

for computing a respective hash value as a hash function of the selected location identifier;

for computing a modular arithmetic remainder of the hash value relative to a modulus;

for determining whether the modular arithmetic remainder satisfies a simulated cache inclusion criterion; and for selecting, as the selected samples of location identifiers, those location identifiers whose modular arithmetic remainder satisfies a simulated cache inclusion criterion;

and for compiling the cache utility values for determination of respective cache utility for the respective entities.

23. A system as in claim 22, in which the cache analysis system is further provided:

for evaluating a reuse-distance distribution for the simulated cache entries and a rate of change of the reuse-distance distribution; and for increasing the rate at which submitted identifiers are sampled when the rate of change is above a first threshold value and decreasing the rate at which the submitted identifiers are sampled when the rate of change is below a second threshold value.

24. A system as in claim 22, in which:
the cache utility value is a cache utility ratio; and
the cache analysis system is further provided for adjusting the cache utility ratio as a function of time since the storage location identifiers have been submitted by the currently selected entity.

25. A system as in claim 22, in which:
the cache utility value is a cache utility rate; and
the cache analysis system is further provided for measuring the respective cache utility rate for the entities and for allocating cache space among the selected ones of the entities also as a function of their respective cache utility rates.

26. A system as in claim 25, in which the cache utility rate indicates cache access results per system event.

27. A system as in claim 25, in which the system event is chosen from the group: instructions executed, either as an absolute number or per some unit time; elapsed time; translation lookaside buffer (TLB) misses; number of transactions processed; application-level and workload-specific operations such as database query count.

28. A system as in claim 22, in which the cache utility value is a cache miss ratio.

29. A system as in claim 22, in which the cache utility value is a point on a miss rate curve (MRC).

30. A system as in claim 22, in which the cache utility ratio is a cache hit ratio.

31. A system as in claim 22, in which:
the simulated cache is configured as a least-recently used (LRU) data structure configured as a Mattson stack;
the cache analysis system is provided for varying the cache size allocation options hypothetically by changing a reuse-distance cutoff value; and for determining whether the simulated cache includes cache entries corresponding to the sampled location identifiers by comparing a current reuse distance associated with each of the sampled location identifiers with the reuse-distance cutoff value.

32. A system as in claim 22, in which the cache analysis system is configured within a system that is separate from the computer system that includes the storage system.

33. A system as in claim 22, in which the cache in the computer system is managed using a non-Least-Recently-Used replacement policy for entries from a plurality of the entities, further comprising: a simulated cache for each entity, said cache utility values being compiled per simulated cache.

34. A system as in claim 33, in which the simulated caches function sequentially.

35. A system as in claim 33, in which the simulated caches function simultaneously, in parallel.

36. A system as in claim 33, in which the simulated cache is a simulated cache component that comprises a plurality of simulated caches of different sizes implementing the plurality of cache size allocation options.

* * * * *